United States Patent
Hsiao et al.

(10) Patent No.: US 9,634,122 B2
(45) Date of Patent: Apr. 25, 2017

(54) DEVICE BOOST BY QUASI-FINFET

(71) Applicant: Taiwan Semiconductor Manufacturing Co., Ltd., Hsin-Chu (TW)

(72) Inventors: Ru-Shang Hsiao, Jhubei (TW); Ling-Sung Wang, Tainan (TW); Chih-Mu Huang, Tainan (TW); Chia-Ming Chang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 87 days.

(21) Appl. No.: 14/205,841

(22) Filed: Mar. 12, 2014

(65) Prior Publication Data

US 2015/0263136 A1    Sep. 17, 2015

(51) Int. Cl.
*H01L 21/46* (2006.01)
*H01L 29/66* (2006.01)
*H01L 29/06* (2006.01)
*H01L 21/762* (2006.01)
*H01L 21/28* (2006.01)
*H01L 29/423* (2006.01)

(52) U.S. Cl.
CPC .. *H01L 29/66795* (2013.01); *H01L 21/28114* (2013.01); *H01L 21/76224* (2013.01); *H01L 29/0649* (2013.01); *H01L 29/4236* (2013.01); *H01L 29/42376* (2013.01); *H01L 29/66545* (2013.01)

(58) Field of Classification Search
CPC ......... H01L 29/7854; H01L 2924/0002; H01L 2924/00; H01L 29/7848; H01L 29/66636
See application file for complete search history.

(56) References Cited

U.S. PATENT DOCUMENTS

| | | | |
|---|---|---|---|
| 7,250,346 B2* | 7/2007 | Chun | H01L 21/76229 257/E21.548 |
| 8,614,127 B1* | 12/2013 | Yang | H01L 29/66795 257/E21.429 |
| RE45,165 E * | 9/2014 | Chen | 257/255 |
| 2005/0239254 A1* | 10/2005 | Chi | H01L 29/7853 438/270 |

(Continued)

*Primary Examiner* — Robert Bachner
(74) *Attorney, Agent, or Firm* — Eschweiler & Potashnik, LLC

(57) ABSTRACT

Some embodiments relate to an integrated circuit (IC) including one or more field-effect transistor devices. A field effect transistor device includes source/drain regions disposed in an active region of a semiconductor substrate and separated from one another along a first direction by a channel region. A shallow trench isolation (STI) region, which has an upper STI surface, laterally surrounds the active region. The STI region includes trench regions, which have lower trench surfaces below the upper STI surface and which extend from opposite sides of the channel region in a second direction which intersects the first direction. A metal gate electrode extends in the second direction and has lower portions which are disposed in the trench regions and which are separated from one another by the channel region. The metal gate electrode has an upper portion bridging over the channel region to couple the lower portions to one another.

20 Claims, 8 Drawing Sheets

(56) References Cited

U.S. PATENT DOCUMENTS

| | | | |
|---|---|---|---|
| 2006/0006478 A1* | 1/2006 | Kanegae | H01L 21/28052 257/382 |
| 2008/0299734 A1* | 12/2008 | Lee | H01L 29/66818 438/300 |
| 2009/0294857 A1* | 12/2009 | Lee | H01L 27/10876 257/365 |
| 2013/0171792 A1* | 7/2013 | Wan | H01L 21/3065 438/294 |
| 2014/0197456 A1* | 7/2014 | Wang | H01L 29/785 257/192 |
| 2015/0263136 A1* | 9/2015 | Hsiao | H01L 29/66795 257/401 |
| 2015/0294874 A1* | 10/2015 | Lin | H01L 21/28114 257/401 |

\* cited by examiner

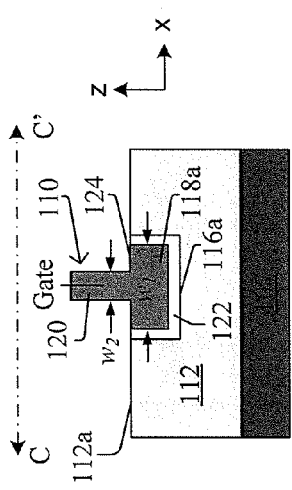
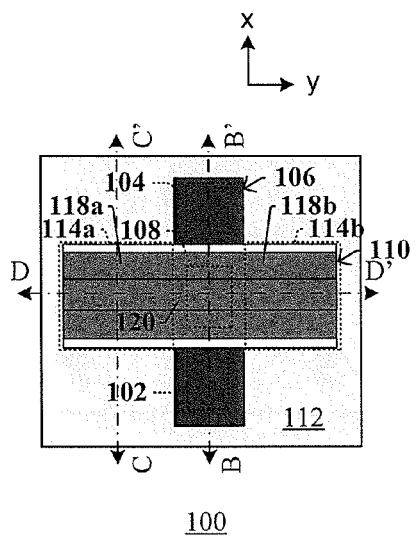
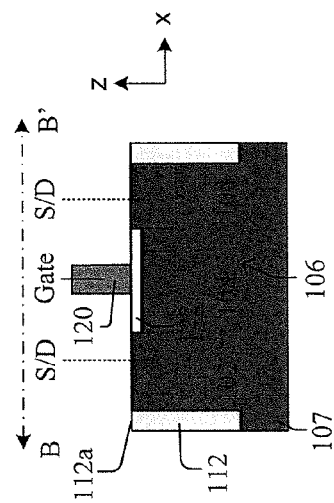
Fig. 2C        Fig. 2A        Fig. 2B
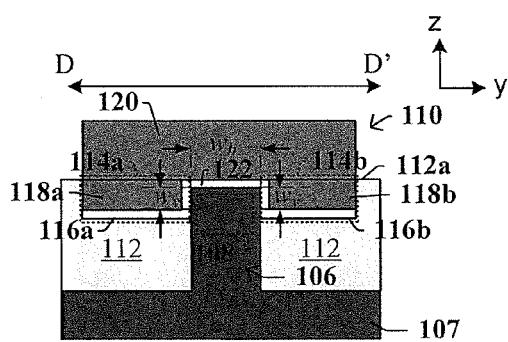
Fig. 2D

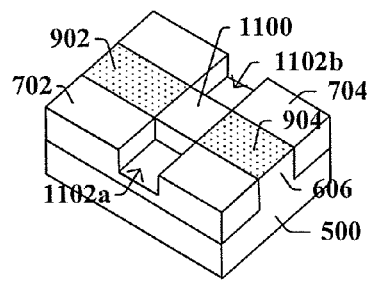 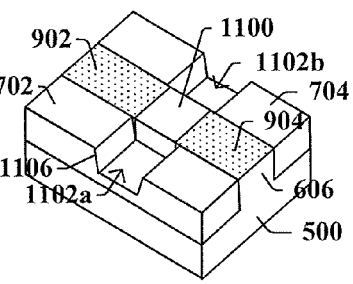 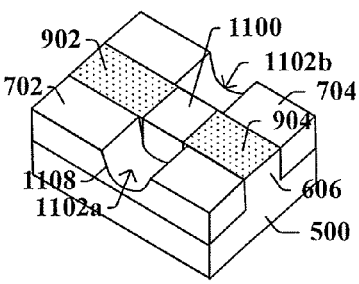
Fig. 11A            Fig. 11B            Fig. 11C
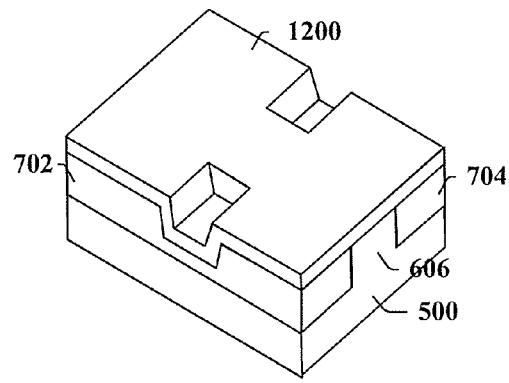
Fig. 12
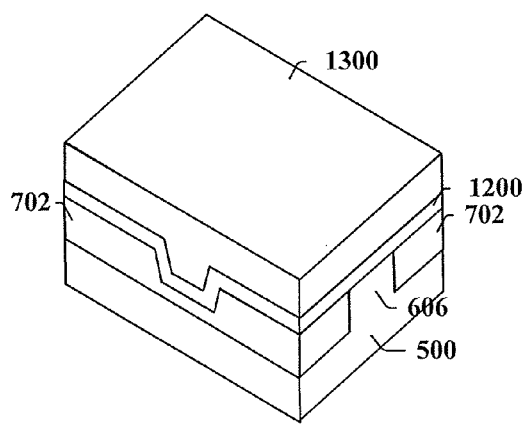
Fig. 13

DEVICE BOOST BY QUASI-FINFET

BACKGROUND

Over the last four decades, the density of integrated circuits has increased by a relation known as Moore's law. Stated simply, Moore's law says that the number of transistors on integrated circuits (ICs) doubles approximately every 18 months. Thus, as long as the semiconductor industry can continue to uphold this simple "law," ICs double in speed and power approximately every 18 months. In large part, this remarkable increase in the speed and power of ICs has ushered in the dawn of today's information age.

Unlike laws of nature, which hold true regardless of mankind's activities, Moore's law only holds true only so long as innovators can continue to overcome the technological challenges associated with it. In particular, one trend to increase transistor density in recent years is to go to three dimensional gates—so called "FinFETs"—which tend to improve performance compared to conventional planar device at equal power supply voltages. Unfortunately, FinFETs are difficult to manufacture in many respects compared to conventional planar MOSFET devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A illustrates a top view of a semiconductor device in accordance with some embodiments.

FIGS. 2B-2D illustrate cross-sectional views of FIG. 2A's device in accordance with some embodiments.

FIGS. 5 through 16 illustrate a series of perspective views that collectively depict a method for forming a semiconductor device in accordance with some embodiments.

DETAILED DESCRIPTION

Figure 1:
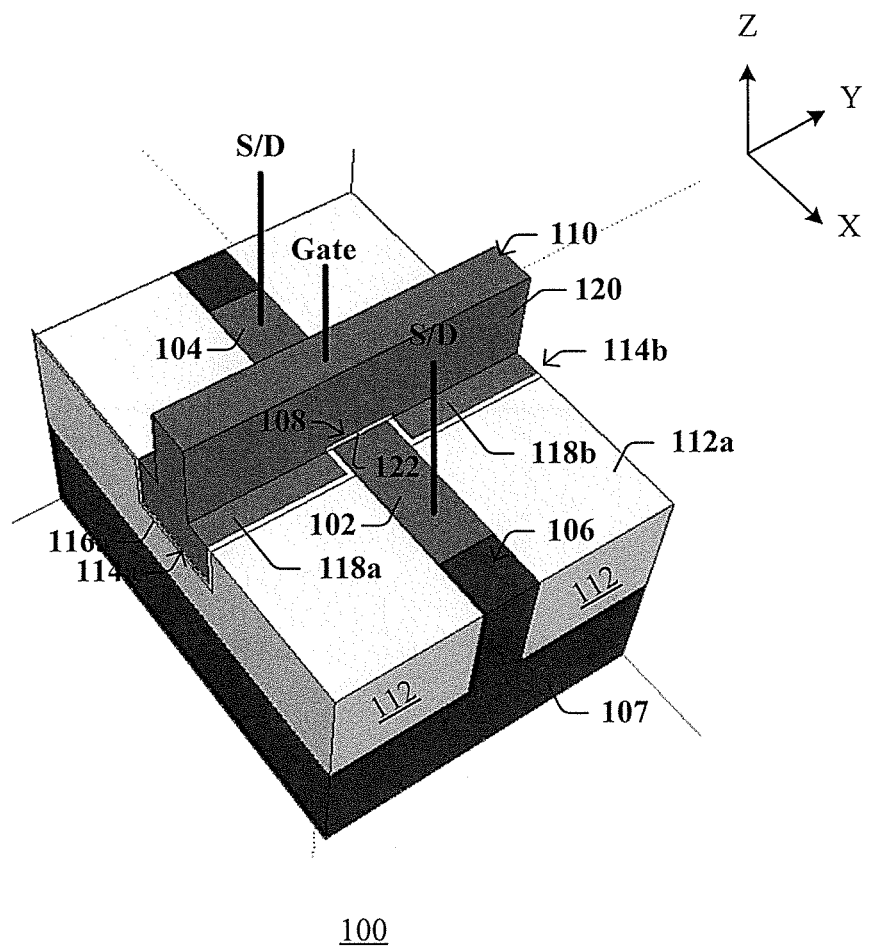
FIG. 1 illustrates a perspective view of a semiconductor device in accordance with some embodiments.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a portion of an integrated circuit (IC) 100 which includes a field effect transistor device 100 in accordance with some embodiments. The device 100 includes source drain/regions (S/D) 102, 104 disposed in an active region 106 of a semiconductor substrate 107. The S/D regions 102, 104, which have a first doping type (e.g., n-type), are separated from one another along a first direction (e.g., x-direction) by a channel region 108, which has a second, opposite doping type (e.g., p-type). A shallow trench isolation (STI) region 112, which has an upper STI surface 112a, laterally surrounds the active region 106. Trench regions 114a, 114b, which have lower trench surfaces 116a, 116b, respectively, which are arranged below the upper STI surface 112a and which extend from opposite sides of the channel region 108 in a second direction (e.g., y-direction). A metal gate electrode 110 has lower portions 118a, 118b which are disposed in the trench regions 114a, 114b, respectively, and an upper portion 120 bridging over the channel region 108 to couple the lower portions 118a, 118b to one another. A gate dielectric 122 separates the conductive gate electrode 110 from the channel region 108, and in some embodiments has an upper surface that directly abuts a lower surface of the metal gate electrode 110 and has a lower surface that directly abuts an upper surface of channel region 108.

During operation, bias circuitry can apply a gate voltage to the gate electrode 110, which can cause charge carriers to accumulate in the channel region 108 or can cause inversion in the channel region 108, depending on the magnitude of the applied gate voltage. While the gate voltage is applied, the bias circuitry concurrently applies a voltage between the S/D regions 102, 104, which will sweep charge carriers between S/D regions 102, 104 and thereby cause current to flow (i.e., the transistor device is "on"). If a magnitude of the gate voltage is less than a threshold voltage of the transistor device, very little or no current flows between S/D regions 102, 104 (i.e., the transistor device is in a sub-threshold mode or is "off").

By virtue of the lower portions 118a, 118b of the metal gate electrode 110 being recessed below the upper STI surface 112a, the device 100 exhibits enhanced depletion in the channel region 108, relative to conventional planar transistors. In particular, the current between source/drain regions 102, 104 can be represented according to the following equation:

$$I_d \propto \mu_{eff} C_{dielectric} \frac{W}{L}(V_{gs} - V_t),$$

Where $\mu_{eff}$ is the effective carrier mobility of carriers in the channel region 108, $C_{dielectric}$ is the capacitance of the gate dielectric, W is the width of the channel 108 in the second direction, L is the length of the channel 108 in the first direction, $V_{gs}$ is a gate-source voltage, and $V_t$ is a threshold voltage of the device. Notably, compared to a conventional planar transistor whose channel width W is set to correspond to solely a planar width of the channel 108 under the gate dielectric, the width W for the device 100 is increased, due to the lower portions 118a, 118b being recessed along sidewalls of the channel 108. As shown in FIG. 2D, the overall channel width W of the device 100 is a sum of horizontal planar width $W_h$ plus twice the vertical recess depth $W_v$. Therefore, the source/drain current is increased compared to conventional planar devices as more clearly shown by the following equation:

$$I_d \propto \mu_{eff} C_{dielectric} \frac{(W_h + 2W_v)}{L}(V_{gs} - V_t).$$

In other words, as the recess depth for the lower portions 118a, 118b of the metal gate electrode 110 is increased, the current flow increases proportionally, due to greater depletion and/or charge accumulation. In some embodiments, for example, the vertical recess depth, $w_v$, may range from approximately 10 Angstroms to approximately 1 nm; and/or may be approximately 5% to approximately 75% of the total depth of the STI region 112, although precise values for the depths can vary widely.

FIG. 2A shows a top view of FIG. 1's transistor device, and FIGS. 2B-2D show various cross-sectional views as indicated. For convenience, similar features in FIG. 1 and FIGS. 2A-2D are denoted by the same reference numerals. As shown in FIG. 2C, the lower portions (e.g., 118b) of the metal gate electrode 110 have a first width, $w_1$, measured along the first direction, and the upper portion 120 of the metal gate electrode 110 has a second, different width, $w_2$, measured along the first direction. In the example of FIG. 2C, the first width, $w_1$, is larger than the second width, $w_2$, so the metal gate electrode 110 has an inverted T-shape over the STI regions 112.

As shown in FIGS. 2C-2D, in some embodiments the upper portion 120 meets the lower portions 118a, 118b of the metal gate electrode 110 at a shoulder 124. This shoulder 124 can include a lower surface corresponding to a horizontal plane which is substantially aligned to an upper surface of the gate dielectric 122. As also shown in FIG. 2D, the upper portion 120 of the gate electrode 110 has ends 126a, 126b that are commensurate with lower portion ends 128a, 128b, and the upper portion 120 extends continuously over the lower portions between the ends of the lower portion of the gate electrode 110.

Figure 3A:
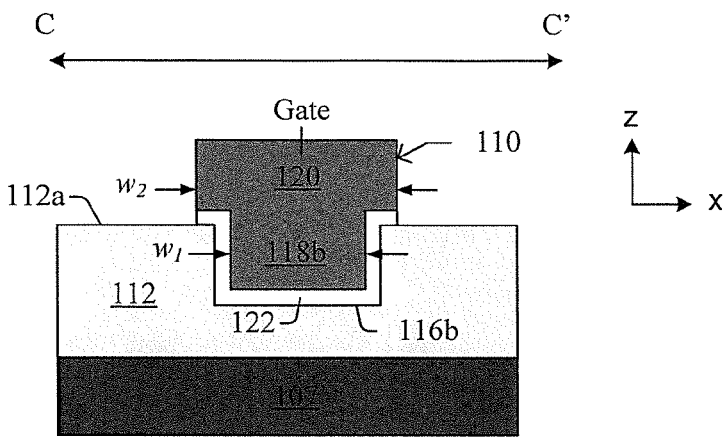
FIGS. 3A-3C illustrate some example alternative cross-sectional views of FIG. 2A's device in accordance with some embodiments.
Figure 3B:
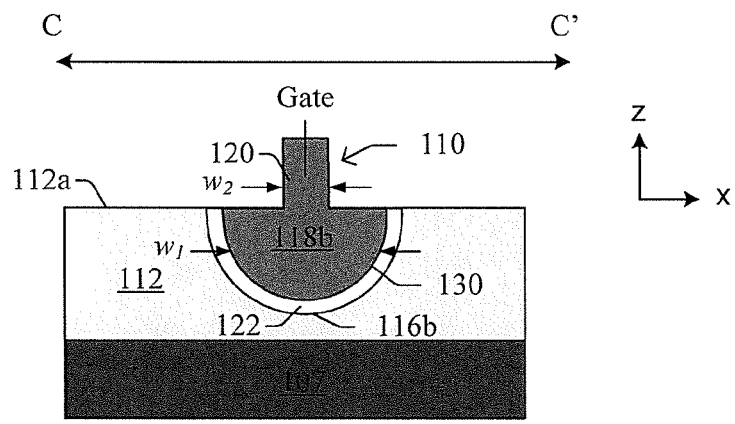
Figure 3C:
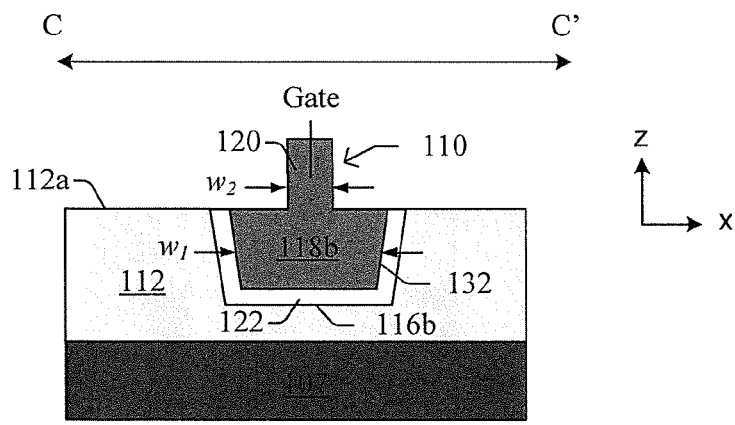

Depending on how the device 100 is manufactured, several variations for the metal gate electrode 110 can exist, some of which are shown in FIGS. 3A-3C. For example, although FIGS. 1-2 illustrated examples where the first width, $w_1$, of the lower portion is greater than the second width, $w_2$, of the upper portion, as shown in FIG. 3A, in other embodiments the first width, $w_1$, can be less than the second width, $w_2$. In other embodiments, the first and second widths $w_1$, $w_2$ could be equal, such that the sidewalls of the upper and lower portions 120, 118 form a planar surface. Further, as shown in FIG. 3B, rather than the sidewalls of the lower portion 118 of the gate electrode 110 being planar, the lower portion 118 of the gate electrode 110 can have a rounded lower surface and rounded sidewalls 130 in other embodiments. Further still, as shown in FIG. 3C, in some embodiments sidewalls of a trench region are tapered 132 so an upper region of the trench region is defined by an opening whose width is larger than a lower surface of the trench region. In particular, the configurations of FIGS. 3B-3C may promote improved formation for replacement gate structures, as the upper region being more open allows better filling to occur during manufacture.

Figure 4:
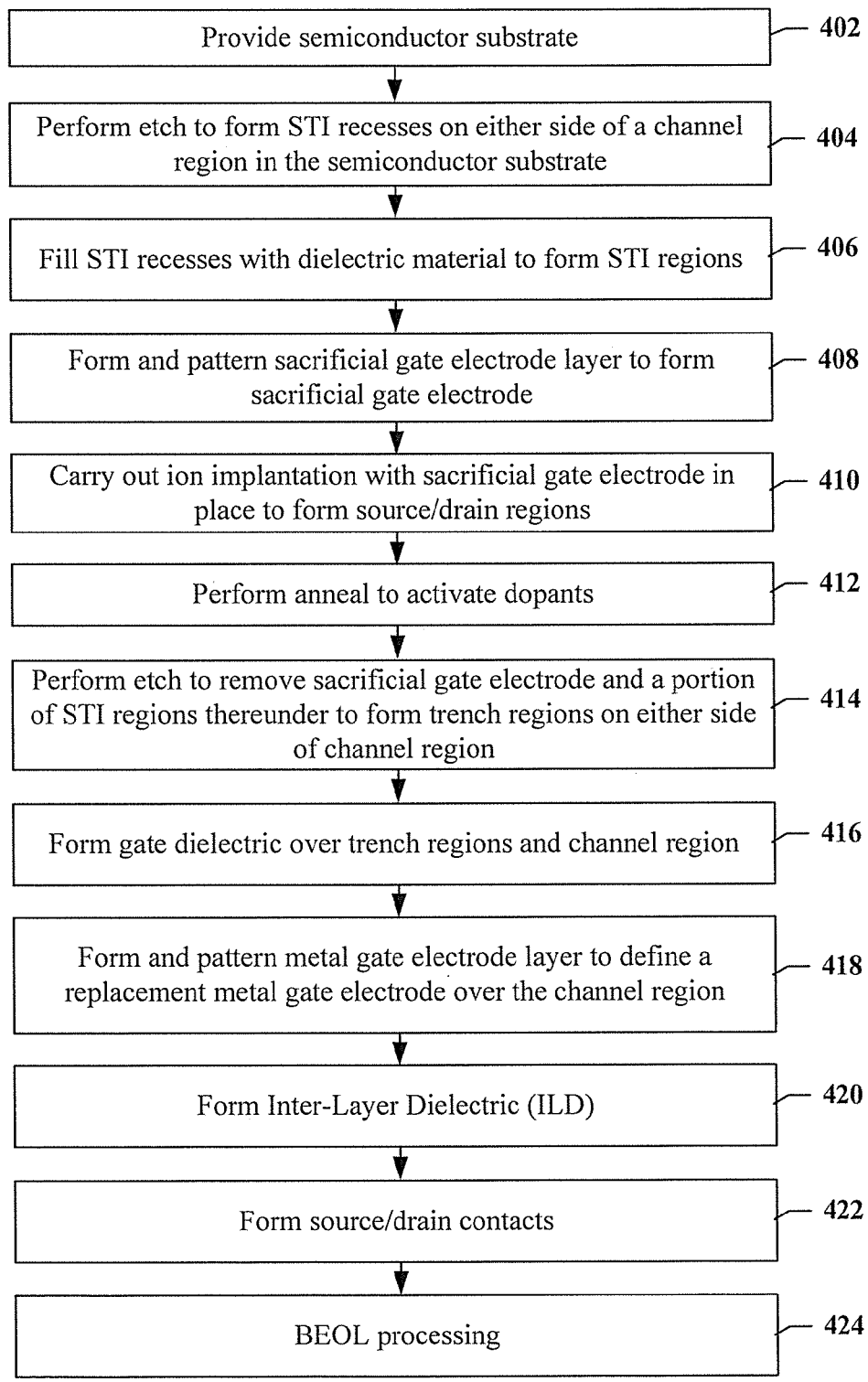
FIG. 4 illustrates a method of forming a device in flowchart form in accordance with some embodiments.

FIG. 4 shows a method 400 of forming a transistor device in accordance with some embodiments. In 402, a semiconductor substrate is provided. In 404, the substrate is etched to form STI recesses on either side of an active region, which includes a channel region therein. In 406, STI regions are formed by filling the STI recesses with dielectric material. In 408, a sacrificial gate electrode layer is formed over the STI regions and patterned to form a sacrificial gate electrode. In 410, ion implantation is carried out to form source/drain regions. In 412, an anneal is carried out to activate the implanted dopants. In 414, an etch is performed to remove the sacrificial gate electrode and to remove a portion of the STI region under the sacrificial gate electrode to form trench regions on either side of the channel region. In 416, a gate dielectric is formed over the trench regions and the channel region. In 418, a metal gate electrode layer is formed and patterned to define a replacement metal gate structure over the channel region. In 420, an interlayer dielectric (ILD) is formed. In 422 source/drain contacts are formed, after which back end of line (BEOL) processing, such as formation of interconnect, is performed in 424.

Turning now to FIG. 5 through FIG. 16, one can see an example manufacturing flow that is described with regards to the method of FIG. 4. In particular, FIGS. 5-16 show a series of perspective views that depict a transistor device at various stages of manufacture. It will be appreciated that these perspective views, although consistent with some embodiments of FIG. 4's methodology, in no way limit FIG. 4's methodology. For example, in other embodiments, some acts of FIG. 4 may be omitted, other acts non illustrated in FIG. 4 may be added, and/or the acts illustrated in FIG. 4 may be performed in different orders. All such embodiments are contemplated as falling within the scope of this disclosure.

Figure 5:
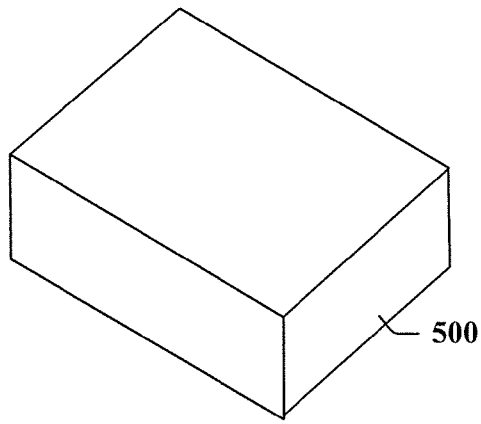

In FIG. 5 (FIG. 4, 402), a semiconductor substrate 500 is provided. The substrate 500 can be a bulk silicon substrate, a silicon on insulator (SOI) substrate, a binary semiconductor substrate (e.g., GaAs), tertiary semiconductor substrate (e.g., AlGaAs), or higher order semiconductor substrates. Any of these substrates can include doped regions formed in the substrate, one or more insulating layers formed in or on the substrate, and/or conducting layers formed in or on the substrate.

Figure 6:
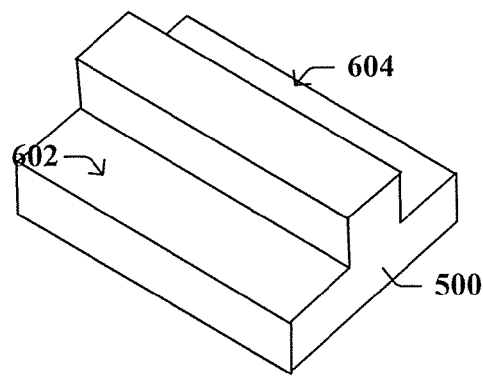

In FIG. 6 (FIG. 4, 404), a mask (not shown) has been patterned over the substrate 500 and an etch has been performed to form STI recesses 602, 604 on either side of an active region 606 of the substrate. The active region 606 typically has a first doping type, such as p-type, for example.

Figure 7:
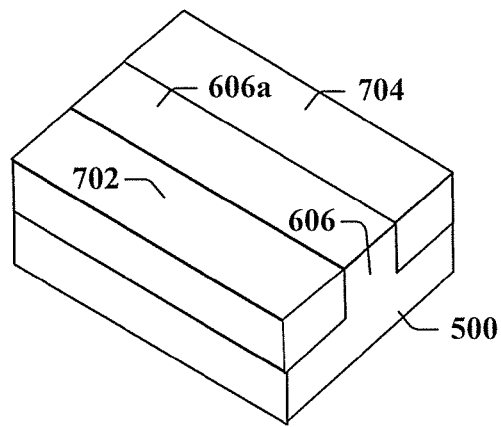

In FIG. 7 (FIG. 4, 406), a layer of dielectric material is formed over the substrate 500 and over STI recesses 602, 604, and can be planarized, for example through chemical mechanical polishing (CMP), to form STI regions 702, 704 that laterally surround the active region. An upper active region surface 606a can be exposed after CMP is completed. The endpoint for CMP can be a predetermined time as measured from a starting time of the CMP operation, or can be determined by optical techniques.

Figure 8:
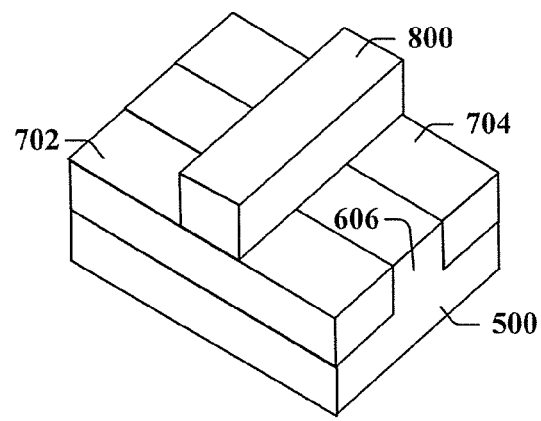

In FIG. 8 (FIG. 4, 408), a sacrificial gate electrode 800 is formed. In some embodiments, the sacrificial gate electrode 800 is formed by forming a polysilicon layer over the STI regions 702, 704 and exposed upper active region surface 606a, patterning a mask over the polysilicon layer, and then performing an etch with the mask in place.

Figure 9:
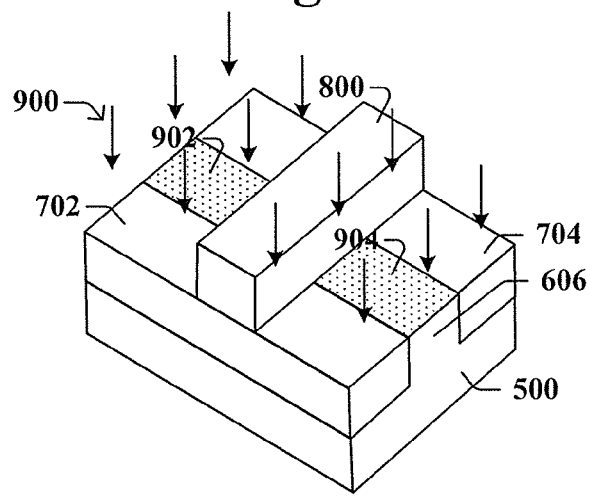
Figure 10:
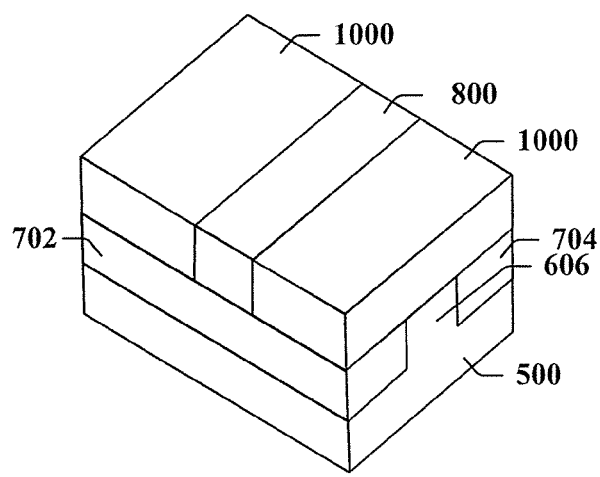

In FIG. 9 (FIG. 4, 410-412), an ion implantation 900 is carried out to form source/drain regions 902, 904, which have a second doping type, such as n-type, for example. The ion implantation 900 can be perpendicular to the substrate—a so-called normal implant. Although not expressly illustrated, lightly doped drain (LDD) regions and/or pocket implant regions, as well as other doped regions can also be formed. After the ion implantation 900 is carried out, an anneal is performed to drive the implanted ions into the active region, to repair lattice defects from the ion implantation, and to activate the implanted dopants In FIG. 10, a protective mask layer 1000 is formed over the source/drain regions 902, 904 and STI regions 702, 704. The protective mask layer 1000 leaves an upper surface of sacrificial gate electrode 800 exposed, and/or can leave sidewall portions of the sacrificial gate electrode exposed.

In FIG. 11A-11C (FIG. 4, 414), an etch has been carried out to remove the sacrificial gate electrode 800 and to remove portions of the STI regions 702, 704 under the sacrificial gate electrode 800 on either side of a channel region 1100, thereby forming trench regions 1102a, 1102b within the STI regions 702, 704 on either side of the channel region 1100. The channel region 1100 is left is place due to the selectivity of the etch between STI region 702, 704 (removed) and active area 606 (left in place). In particular, in FIG. 11A, a directional etch—so called "anisotropic etch"—has been performed to provide the trench regions 1102a, 1102b with vertical sidewalls. In FIG. 11B, the etch has been carried out to provide tapered sidewalls 1106 for the trench regions. In FIG. 11C, an isotropic etch, such as a wet etch for example, has been carried out to provide rounded lower surfaces and sidewalls 1108 for the trench regions. The configurations of FIGS. 11B-11C may promote effective formation for a subsequent replacement gate structure to be formed, as the upper portion of the trench regions is more open and allows better filling to occur during manufacture.

In FIG. 12 (FIG. 4, 416), a gate dielectric 1200 is formed. The gate dielectric 1200 can be a gate oxide, but is more commonly a high-k dielectric. The gate dielectric 1200 can be spun-on or can be deposited in a furnace, via chemical vapor deposition (CVD), via plasma-enhanced CVD (PECVD), or other techniques. The gate dielectric 1200 is typically conformal to the underlying structure.

In FIG. 13 (FIG. 4, 418), a gate electrode layer 1300 is formed over the gate dielectric 1200. The gate electrode layer 1300 is a metal layer, which promotes low-resistance connections and fast device operation. The gate electrode layer can be formed via chemical vapor deposition (CVD), via plasma-enhanced CVD (PECVD), sputtering, plating or electroplate, or other techniques. The gate electrode layer is typically conformal to the underlying structure.

Figure 14:
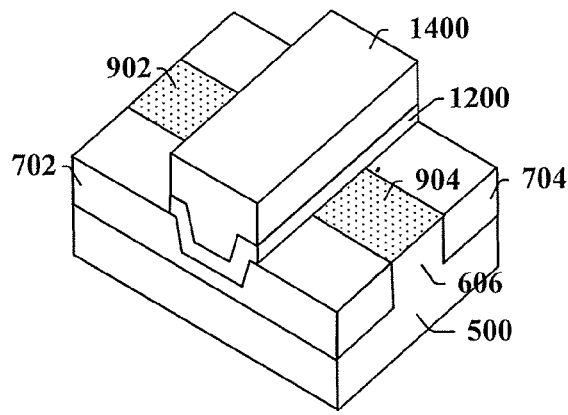

In FIG. 14 (FIG. 4, 418), a mask (not shown) is formed and patterned over the gate electrode layer, and an etch is carried out with the patterned mask in place to form a replacement gate electrode 1400. Typically, this etch is an anisotropic etch to provide the replacement gate electrode with steep sidewalls. The replacement gate electrode has an upper portion above an upper surface of the gate dielectric and a lower portion below the upper surface of the gate dielectric. Although FIG. 14 shows an example where the upper portion has a width that is larger than that of the lower portion, in other embodiments the lower portion can have a width that is larger than that of the upper portion. The widths of the upper and lower portions can also be equal in some embodiments, although this is difficult, practically speaking due to the small tolerances involved.

Figure 15:
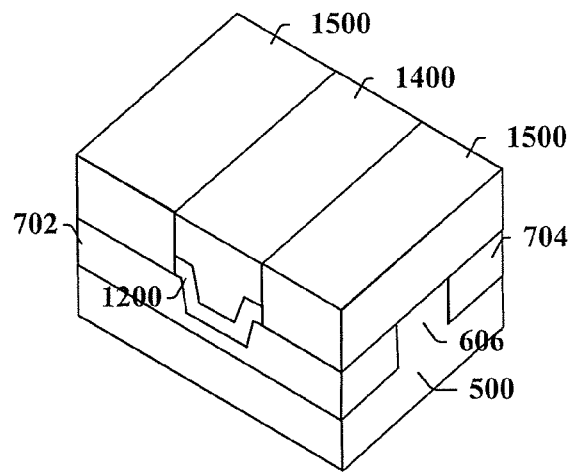

In FIG. 15 (FIG. 4, 420), an ILD layer 1600 is then formed over the patterned gate electrode, and CMP can be performed to planarize an upper surface of the ILD.

Figure 16:
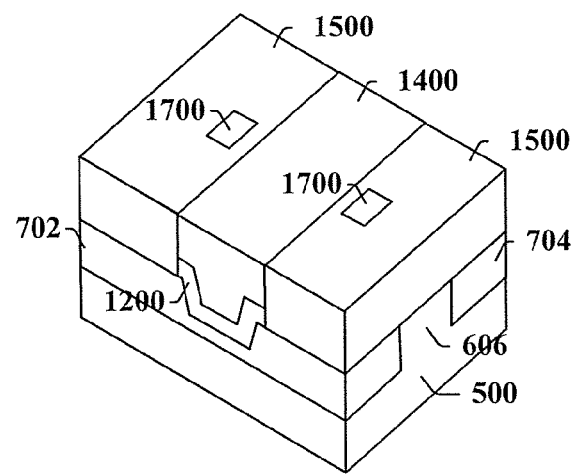

In FIG. 16 (FIG. 4, 422), source/drain contact openings are formed, and subsequently source/drain contacts 1700 are formed.

Thus, it will be appreciated that the present disclosure relates to transistor devices that exhibit greater current drive than conventional devices. In some embodiments, a gate electrode of the transistor is formed in a trench region which is recessed below an upper surface of an STI region. The end result is this recessed gate structure enables greater depletion and/or charge accumulation compared to conventional planar devices, and as such has improved device characteristics.

Some embodiments relate to an integrated circuit (IC) including one or more field-effect transistor devices. A field effect transistor device includes source drain/regions disposed in an active region of a semiconductor substrate and separated from one another along a first direction by a channel region. A shallow trench isolation (STI) region, which has an upper STI surface, laterally surrounds the active region. The STI region includes trench regions, which have lower trench surfaces below the upper STI surface and which extend from opposite sides of the channel region in a second direction which intersects the first direction. A metal gate electrode extends in the second direction and has lower portions which are disposed in the trench regions and which are separated from one another by the channel region. The metal gate electrode has an upper portion bridging over the channel region to couple the lower portions to one another.

Other embodiments relate to an integrated circuit (IC) including one or more field-effect transistor devices. A field effect transistor device includes a silicon substrate having an active area laterally surrounded by a shallow trench isolation (STI) region. Source/drain regions are formed to along a first direction in the active region and are separated from one another in the first direction by a channel region. The STI region is recessed to define trenches extending in a second direction, which traverses the first direction, on opposite sides of the channel region. A gate dielectric layer covers sidewalls of the trench regions and lower surfaces of the trench regions and extends over the channel region. A metal gate electrode extends in the second direction and is separated from the channel region by the gate dielectric layer. The metal gate electrode has lower portions which are disposed in the trenches and which are separated from one another by the channel region. The metal gate electrode has an upper portion bridging over the channel region to couple the lower portions to one another.

Still other embodiments relate to a method of forming a semiconductor device. In this method, a semiconductor substrate is provided, and an etch is performed to form shallow trench isolation (STI) recesses on either side of an active region in the semiconductor substrate. The STI recesses are filled with dielectric material to form STI regions on either side of the channel region. A sacrificial gate electrode layer is formed and patterned over the channel region and STI regions to form a sacrificial gate electrode. Ion implantation is carried out with the sacrificial gate electrode in place to form source/drain regions which are separated by a channel region in the active region. An etch is performed to remove the sacrificial gate electrode along with a portion of STI region there under to form trench recesses in the STI region on either side of the channel region. A gate dielectric is formed within the trench recesses and over the channel region. A replacement metal gate electrode is formed over the channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) including one or more field-effect transistor devices, a field effect transistor device comprising:
   source/drain regions disposed in an active region of a semiconductor substrate and separated from one another along a first direction by a channel region;
   a shallow trench isolation (STI) region, which has an upper STI surface, laterally surrounding the active region, wherein the STI region includes trench regions, which have lower trench surfaces below the upper STI surface and which extend from opposite sides of the channel region in a second direction which intersects the first direction, wherein sidewalls of the trench regions are tapered so openings at upper regions of the trench regions have widths which are larger than openings at lower regions of the trench regions; and
   a metal gate electrode extending in the second direction, the metal gate electrode having lower portions which are disposed in the trench regions and which are separated from one another by the channel region, and having an upper portion bridging over the channel region to couple the lower portions to one another.

2. The IC of claim 1, wherein a lower surface of the metal gate electrode is proximate to an upper surface of the channel region and lower inner sidewalls of the gate electrode are proximate to upper outer sidewalls of the channel region to enhance depletion in the channel region.

3. The IC of claim 2, wherein current through the field-effect transistor device approximately follows the equation below:

$$I_d \propto \mu_{\mathit{eff}} C_{\mathit{dielectric}} \frac{(W_h + 2W_v)}{L}(V_{gs} - V_t);$$

where $\mu_{\mathit{eff}}$ is the effective carrier mobility of carriers in the channel region, $C_{\mathit{dielectric}}$ is the capacitance of a gate dielectric, $W_h+2W_v$ is the width of the channel region, L is the length of the channel region, $V_{gs}$ is a gate-source voltage and $V_t$ is a threshold voltage of the device.

4. The IC of claim 1:
   wherein the lower portions of the metal gate electrode have a first width measured along the first direction; and
   wherein the upper portion of the metal gate electrode has a second width measured along the first direction, wherein the first and second widths are different.

5. The IC of claim 4, wherein the first width of the lower portion is greater than the second width of the upper portion.

6. The IC of claim 4, wherein the first width of the lower portion is less than the second width of the upper portion.

7. The IC of claim 1, wherein a gate dielectric layer covers sidewalls of the trench regions and lower surfaces of the trench regions and extends over the channel region to separate the metal gate electrode from the channel region.

8. The IC of claim 7, wherein the upper portion of the gate electrode has a lower surface directly on the gate dielectric over the channel region.

9. The IC of claim 7, wherein the upper and lower portions of the metal gate electrode meet at a horizontal plane which is aligned to an upper surface of the gate dielectric.

10. The IC of claim 1, wherein the upper portion of the gate electrode has ends that are commensurate with ends of the lower portion of the gate electrode, and wherein the upper portion extends continuously over the lower portion of the gate electrode between the ends of the lower portion of the gate electrode.

11. The IC of claim 1, wherein a lower surface of a trench region is rounded as viewed from an end of the trench region.

12. The IC of claim 4, wherein a ledge extends horizontally between an uppermost region of the lower portion of the metal gate electrode and a lowermost region of the upper portion of the metal gate electrode, the ledge being co-planar with the upper STI surface.

13. An integrated circuit (IC) including one or more field-effect transistor devices, a field effect transistor device comprising:
   a silicon substrate having an active region laterally surrounded by a shallow trench isolation (STI) region, wherein source/drain regions having planar upper surfaces are formed along a first direction in the active region and are separated from one another in the first direction by a channel region, and wherein the STI region is recessed to define trench regions extending in a second direction, which traverses the first direction, on opposite sides of the channel region, the STI region having an upper surface that is co-planar with the planar upper surfaces of the source/drain regions;
   a gate dielectric layer covering sidewalls of the trench regions and lower surfaces of the trench regions and extending over the channel region; and
   a metal gate electrode extending in the second direction and separated from the channel region by the gate dielectric layer, the metal gate electrode having lower portions which are disposed in the trench regions and which are separated from one another by the channel region, and having an upper portion bridging over the channel region to couple the lower portions to one another;
   wherein the upper portion of the gate electrode is narrower than the lower portions of the gate electrode as measured in the first direction; and
   wherein the lower portions of the gate electrode include upper surfaces which extend horizontally to meet sidewalls of the upper portion of the gate electrode and which are co-planar with the upper surface of the STI region.

14. The IC of claim 13, wherein the lower surface of the metal gate electrode is proximate to an upper surface of the channel region, and wherein lower inner sidewalls of the gate electrode are proximate to upper outer sidewalls of the channel region to enhance depletion in the channel region.

15. An integrated circuit (IC) including one or more field-effect transistor devices, a field effect transistor device comprising:
   a silicon substrate having an active region that projects upwardly from a base portion of the silicon substrate, the active region extending longitudinally in a first direction over the base portion of the silicon substrate;
   a shallow trench isolation (STI) region arranged over the base portion and laterally surrounding the active region, the STI region having a depth measured between upper and lower surfaces of the STI region at ends of the active region along the first direction, and having recesses in the upper surface of the STI region on opposite sides of the active region in a second direction which is perpendicular to the first direction;

source/drain regions disposed in the active region and separated from one another a channel region in the active region;

a gate dielectric layer extending over the channel region and extending downwardly along sidewalls and lower surfaces of the recesses; and a gate electrode having lower portions which are disposed in the recesses on the opposite sides of the active region and having an upper portion bridging over the gate dielectric layer to couple the lower portions to one another, wherein the upper portion of the gate electrode is narrower than the lower portions of the gate electrode as measured along the first direction.

16. The IC of claim 15, wherein lower surfaces of the recesses are rounded as viewed from an end of one of the recesses.

17. The IC of claim 15, wherein sidewalls of the recesses are tapered so an upper region of the recesses is defined by an opening whose width is larger than a lower region of the recesses.

18. The IC of claim 15, wherein sidewalls of the recesses are vertical and are perpendicular to an upper planar surface of the STI region.

19. The IC of claim 13, wherein sidewalls of the recesses are tapered so upper regions of the recesses are defined by openings whose widths are larger than widths of lower regions of the recesses.

20. The IC of claim 13, wherein lower surfaces of the trench regions are rounded as viewed from an end of one of the trench regions.

* * * * *